April 26, 1966 M. FROMER 3,248,665

TUNING SYSTEM FOR A MAGNETRON OSCILLATOR UTILIZING DIFFERENTIAL TRANSFORMER CONTROLS

Filed Feb. 26, 1964

INVENTOR.
MORTON FROMER

BY Morris [signature]

Attorney

United States Patent Office 3,248,665
Patented Apr. 26, 1966

3,248,665

TUNING SYSTEM FOR A MAGNETRON OSCILLATOR UTILIZING DIFFERENTIAL TRANSFORMER CONTROLS

Morton Fromer, Maplewood, N.J., assignor to Radio Corporation of America, a corporation of Delaware Filed Feb. 26, 1964, Ser. No. 347,424
3 Claims. (Cl. 331—90)

The invention relates to a transformer device, and to the combination of such a device with a tunable magnetron oscillator.

By moving tuning elements into and out of the anode cavities of a magnetron oscillator tube, the frequency of the oscillator may be increased or decreased. However, the graph or curve of the frequency of the magnetron oscillator plotted against the position of the tuning element is not a straight line but includes two differently curved branches. While the branches are not linear, the curve can be approximated, within acceptable tolerances, by two straight lines having different slopes joined by an intervening transitional segment.

The generally non-linear curves of frequency v. position of the tunable magnetron tubes made by the same manufacturer for a given design are quite similar. The general non-linear curves of the frequency v. position curves of magnetron tubes made by different manufacturers may differ. However, they resemble each other in that, as pointed out above, they may be approximated, within acceptable tolerances by two straight lines having different slopes joined by a transitional segment. The curves for different tubes differ from each other in that the slopes of the branches of the curves and the positions of the transitional segments may vary from tube to tube.

In controlling the frequency, or the rate of change of frequency, of a magnetron oscillator from a remote point, a control voltage may be applied to a servo loop to control a linear actuator connected to the linearly movable tuning elements of the magnetron tube. A voltage indicating the position, or the rate of motion of, the tuning element may be fed back in the servo loop and combined with the control voltage to produce an error voltage for controlling the linear actuator. Since the curve of position of the tuning element of the magnetron v. the frequency thereof is not a straight line, the feedback voltage may not indicate the tuning, or the rate of change of tuning, of the magnetron oscillator, but rather the position, or the rate of change of position, of the tuning element. Therefore, the servo loop should be so constructed as to cause the magnetron to generate the desired frequency, or change in frequency, in response to an applied control voltage in spite of this non-linearity of its tuning v. position curve. Therefore, when, in a servo system involving a tunable magnetron, the magnetron tube is replaced, a magnetron tube made by the same manufacturer should be acquired or extensive changes made in the control system. Magnetron tubes are very expensive, and it is advantageous to be able to use magnetron tubes made by several manufacturers.

It is an object of this invention to provide an improved remotely controllable tuning device for a magnetron oscillator.

It is a further object of this invention to provide means for adapting a pre-existent system using a tunable magnetron tube to a magnetron tube having a different curve of position of its tuning element v. its frequency.

It is still a further object of this invention to provide an improved device for tuning a magnetron oscillator at a determinable rate of frequency change through a preselected frequency v. time cycle.

In accordance with this inventioin, a differential transformer and magnetron tuner combination is provided. The transformer has three coils, one, the primary, between the other two secondary coils. The number of turns in each of the secondary coils is different, and the two secondary coils are connected in opposition. A core of magnetic material is movable through the coils. When a supply voltage is applied to the middle, or primary, coil, a position of the core can be found at which the voltage output of the secondary coils is substantially zero. The output voltage of the secondary coils increases at first in a curved manner and then substantially linearly as the core is moved from its zero position, the phase of the output voltage reversing as the core goes through the zero position. However, the slopes of the legs of the curve of voltage v. core position exhibited by the transformer will be different as the core is moved in opposite directions from the zero point, and the relative slopes of the two legs of the curves may be selected by changing the ratio of the turns of the two secondary coils. By increasing or decreasing the primary voltage, the slopes of these legs of the output curves are increased or decreased, whereby the curves may be rotated about the zero voltage point. If it is desired to maintain the primary voltage constant, the slopes of both legs may be changed by changing the ratio of turns in the primary coil to the turns in the two secondary coils, while maintaining the ratio of the turns of the two secondary coils unchanged. Due to coupling between the secondary coils, the curve of core position v. voltage of the transformer includes a smoothly curved transitional segment, which includes the zero or null point, between the legs thereof. By a judicious choice of the number of turns of the several coils of the transformer, a transformer may be provided having any one of a great many curves of position of the core v. output voltage, and therefore such a transformer may be provided that has a curve of core position v. voltage resembling (matching) the curve of tuner position v. tuning of any selected one of the many of the presently manufactured magnetron tubes.

In adapting a previously constructed system including a magnetron tube to use a different, replacement magnetron tube having a different curve of frequency v. position of its tuning element, a differential transformer is provided having a curve of voltage v. position of the core thereof similar to the curve of frequency v. position of the tuning element of the magnetron. The differential transformer is then substituted in the system for the tuner position indicator thereof and the position of the core of the transformer is adjusted so that a point on the transitional line between the two chanches of the tuning curve of the magnetron and the zero voltage, or null point, of the curve of the transformer are substantially coincident. Since the slopes of the two branches of the magnetron tuning curve are respectively substantially equal to the slopes of the legs of the transformer output curve, the voltage output of the transformer is a measure of the frequency of the tuning of the magnetron within acceptable tolerances. The voltage of the differential transformer may therefore be used as a feedback voltage in a servo loop which controls the frequency of the magnetron.

The novel features of this invention, both as to its organization and method of assembly and operation, as well as additional objects and advantages hereof, will be understood more readily from the following description when read in conjunction with the accompanying drawing, in which.

Figures 1, 2, 3, 4, 5:
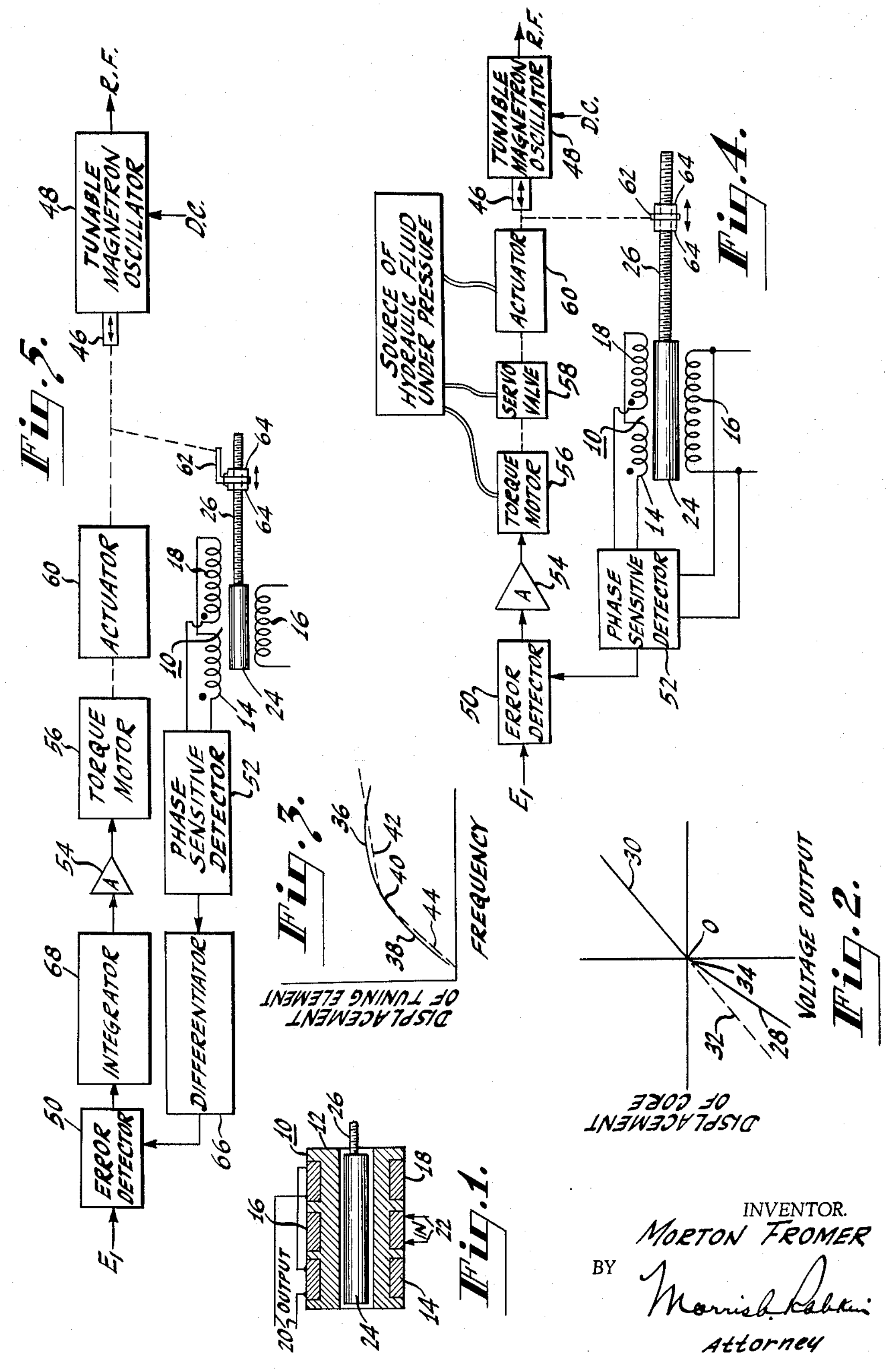
FIG. 1 shows one form of a two slope differential transformer in accordance with this invention.
FIG. 2 is a graph of the curve of the linear translational displacement of the transformer core v. the output voltage of the differential transformer of FIG. 1.
FIG. 3 is a graph of the curve of the linear translational displacement of the tuner v. the frequency of a conventional magnetron oscillator.
FIG. 4 is a diagrammatic representation of a remotely controlled device of tuning a magnetron oscillator using the two slope differential transformer of FIG. 1.
FIG. 5 is a diagrammatic representation of a remotely controlled device for controlling the rate of variation of tuning of a magnetron oscillator using the two slope differential transformer of FIG. 1.

FIG. 1 shows a two slope differential transformer 10 which may comprise an annular body or stator form 12 having three grooves arranged along the length thereof, respectively including a winding 14, 16 and 18, the number of turns in the respective outside or secondary windings 14 and 18 being different. The two secondary windings 14 and 18 are connected to output terminals 20 in phase opposition. The middle, or primary, winding 16 is connected to input terminals 22. A cylindrical, movable core 24 of magnetic material is provided, the core having a rod 26 extending from one end thereof. This rod 26 may be threaded along most of its length for a purpose presently to be set forth.

The operation of this differential transformer may be understood by reference to FIG. 2 in which the output voltage appearing at output terminals 20 is plotted, along the horizontal axis, against the position of the core, for a constant, alternating voltage applied to the input terminals 22. A position of the core 24 may be found where the couplings between the primary winding 16 and the secondary windings 14 and 18 are equal. At this position of the core, the output voltage is zero, as indicated by 0 in FIG. 3, and the voltage may increase in either direction of motion of the core from this zero point. However, the phase of the output voltage reverses as the core is moved through its zero position. Furthermore, the voltage output increases at a greater rate in a direction of motion of the core towards the secondary winding having the greater number of turns that it does during motion of the core in the opposite direction from its zero point, as indicated by the slopes of the legs 28 and 30, respectively, of the curve of FIG. 3. The dotted line 32, which is an extension of the leg 30 into the third quadrant, is provided to make more evident the difference in slope between these two legs 28 and 30 of the curve. Due to coupling between secondary coils 14 and 18, a smooth transitional segment of curve 34 joins the two legs 28 and 30.

The slope of both of the legs 28 and 30 may be decreased or increased by respectively decreasing or increasing the input voltage applied to the primary winding 16, whereby the curve may be rotated about its null point 0. By preselecting the number of turns in the several windings 14, 16 and 18, a differential transformer 10 may be provided which, with any preselected input voltage, exhibits a curve of voltage output v. core displacement having any one of many desired slopes of the two legs 28 and 30 thereof.

The curve of frequency v. displacement of the tuning element of a typical magnetron oscillator is shown in FIG. 3. This curve can be viewed as comprising two substantially straight branches 36 and 38 having different slopes and joined by a smooth transitional segment 40, as shown by comparison with straight lines 42 and 44. In these respects, the curve in FIG. 3 resembles the curve of FIG. 2. However, a particular magnetron oscillator may exhibit a curve of frequency v. tuner element position in which the slope of the branches 36 and 38 and the position of the transitional segment 40 may differ from these portions of the curve shown in FIG. 3. A differential transformer 10 of proper design may be provided, in the manner described above, exhibiting curves of core displacement v. voltage having two legs 28 and 30 matching the slopes of the two branches 36 and 38 of almost any conventional magnetron. Means to be described are provided in the systems of FIGS. 4 and 5, for adjusting the positions of the transitional segments 34 and 40 with respect to each other.

FIG. 4 shows a system for electrically controlling the position of the tuning element 46, and therefore controlling the tuning of the magnetron oscillator 48 from a remote point. The elements indicated by labelled rectangles and triangles in FIG. 4 (and also in FIG. 5) are known, and therefore their electrical or mechanical connection and their operation in the circuit are described, rather than the detailed construction thereof. A frequency controlling input voltage $E_1$ is applied to an error detector circuit 50, to which a feedback voltage from a phase sensitive detector 52 is also applied. The output of the error detector 50 is equal to the difference of the two applied voltages and varies in direction from zero depending upon which of the two inputs thereto is greater. The difference or error voltage is applied through an amplifier 54 to a hydraulic torque motor 56 the moving part of which moves in a direction and through a distance depending upon the direction and magnitude of the error voltage applied thereto. The torque motor 56 may directly actuate an hydraulic actuator 60, but since the force of the motor produced by the torque motor 56 may be insufficient to operate the valves of the actuator 60, an hydraulically operated servo valve 58 may be controlled by the torque motor 56, and the servo valve 58 may control the hydraulic actuator 60. The coupling of the torque motor 56 to the servo valve 58 or to the actuator 60 is such that, at zero voltage input to the torque motor 56, no differential oil pressure is developed in the hydraulic actuator 60 whereby the moving element thereof (a piston) remains in an intermediate position. The moving element of the actuator 60 is mechanically coupled to the tuning element 46 of the magnetron oscillator 48 which alters the electrical reactance of its resonant cavity, thus changing the output resonant radio frequency RF. Although a magnetron tube may have many tuning elements, for simplicity, only one is indicated. The actuator 60 is also mechanically coupled to a flange 62 surrounding the threaded rod 26 which is fixed to the movable core 24 of the differential transformer 10. The position of the flange 62 on the threaded rod 26 and, therefore, the relative positions of the tuning element 46 and of the core 24 may be adjusted by manipulating the nuts 64, 64 threaded on the rod 26 on opposite sides of the flange 62 to achieve coincidence of the transformer null with a desired frequency of the oscillator intermediate of its range of frequencies and represented by an intermediate point on the transitional segment 40 of the magnetron curve. Alternating input voltage, which may be in the range of 60 to 20,000 cycles per second, is applied to the primary winding 16 of the differential transformer 10, and the output of the transformer, which is an alternating current having a voltage and a phase depending upon the position of the core with respect to the windings 14, 16 and 18, is applied to the phase sensitive detector 52 to which the input voltage is also applied for demodulation purposes. The output of the detector 52, which is a direct current varying in direction and amplitude depending upon the position of the core 24 and, therefore, of the tuning element 46 is applied as feedback voltage to the error detector 50. As noted, the nuts 64, 64 are so manipulated that, when the oscillator is tuned to the desired intermediate point on the transitional segment of its tuning curve, the voltage output of the transformer 24 is zero. Then, as the oscillator tuning element is moved, the voltage applied to the error detector 50 from the detector 52 is a measure, within an acceptable tolerance, of the frequency of the oscillator 48 of all points in the tuning range thereof. When the control and feedback voltages are equal, no voltage will be applied to the torque motor 56, and the tuner 46 of the magnetron 48 will be at the position at which the oscillator 42 provides a frequency determined by the input or control voltage $E_1$. It will be noted that, although the feedback voltage is provided by the two slope differential transformer 10, this voltage is a measure of the frequency of the magnetron oscillator 48 within acceptable tolerances in spite of the fact that the frequency v. tuner position curve of the magnetron tube is not linear.

The system of FIG. 5 differs in operation from the system of FIG. 4 in that the rate of variation of the frequency of the magnetron oscillator 48, rather than the frequency thereof, is remotely controlled. The adjustment of the relative positions of the core 24 and the tuning element 46 is the same in FIGS. 4 and 5. The circuit device of FIG. 5 differs in connection from that of FIG. 4 in that a differentiator 66 is connected between the phase sensitive detector 52 and the error detector 50, and in that an integrator 68 is connected between the error detector 50 and the amplifier 54. In FIG. 5, the control voltage $E_1$ and a feedback voltage are applied to the error detector 50. The output of the error detector is applied to the intergrator 68 and then through the amplifier 54 to the torque motor 56 which controls the hydraulic actuator 60. The coupling of the torque motor 56 to the actuator 60 in FIG. 5 is such that, at zero voltage input to the torque motor 56, the moving element of the actuator has zero velocity. When a control voltage $E_1$ is applied to the error detector 50 and the feedback voltage applied to the error detector 50 is such that error signal output thereof is not zero, the actuator 60 moves in a direction depending on the polarity of the error voltage and at a speed which is a function of the magnitude of the error voltage, causing motion of the tuning element 46 and of the core 24. As the core moves in a direction away from its null position, the transformer output voltage increases, the phase thereof depending on the direction of motion of the core 24 from its null position. This voltage is applied to the phase sensitive detector 52. The voltage output of the phase sensitive detector 52, which is positive or negative depending on the phase of the wave applied thereto, also increases. The output of the detector 52 is applied to the differentiator 56. The output of the differentiator 56 is a voltage proportional to the change of speed of the tuning element 46. The voltage output of the differentiator is subtracted from the control voltage $E_1$ in the error detector 50, whereby the error voltage is decreased. As the error voltage approaches zero, the speed of the moving element of the actuator 60 tends to approach zero. However, the decrease in speed of the actuator moving element causes a decrease in feedback voltage to the error detector 50 whereby the output of the error detector is increased. The final result is that the speed of the actuator is determined by the control voltage $E_1$ and the direction of motion of the actuator is determined by the polarity of the control voltage. The integrator smooths the voltage applied to the torque motor to provide smooth operation thereof. Therefore, the system of FIG. 5 produces a variation in frequency of the magnetron oscillator at a rate and in a direction determined by the input voltage $E_1$ in spite of the fact that the position of its tuning element and not the frequency of the oscillator controls the feedback voltage.

In the embodiments of the invention here shown and described, a differential transformer has many advantages when used for indicating the position of the core thereof and of the linearly movable tuning element of the magnetron oscillator to which it may be fastened. Among these advantages are the fact that the differential transformer has a long life, high reliability, infinite and smooth resolution, lack of noise voltage, simplicity, and cleanliness. Furthermore, a linear translational motion of the core of the transformer results in change of the voltage of the output thereof and, similarly, a linear translational motion of its tuning elements causes change in tuning of the magnetron oscillator. Also, as explained above, a differential transformer may be provided exhibiting a curve of voltage output v. position resembling the curve of frequency v. position of a magnetron oscillator. Therefore, such a differential transformer is particularly adaptable for producing a voltage which is a measure of the frequency of a magnetron oscillator having a linearly movable tuning element.

Although a single two slope differential transformer and only two systems in which the transformer may be included have been shown, it will undoubtedly be apparent to those skilled in the art that variations in the transformer and in the system are possible within the spirit of the present invention. Hence, it will be understood that the above described two slope differential transformer, useful in systems for controlling the frequency of a magnetron oscillator, is to be considered as illustrative and not in a limiting sense. For example, by sectioning the several transformer windings 14, 16 and 18, by variation of the spacing of the sections, by choice of materials having various permeabilities for both the core 24 and the stator 12, and by shaping the air gap therebetween, a differential transformer 10 may be provided exhibiting a curve of output voltage v. position of the core, the legs of which more closely follows the nonlinear branches of the curve of frequency v. displacement exhibited by the tunable magnetron than the curves discussed above.

What is claimed is:

1. The combination of a magnetron tube having a movable tuning element and exhibiting a curve of frequency of tuning v. displacement of said tuning element resembling two branches of different slopes joined by a transitional curved line, and a two slope differential transformer comprising (1) two reversely connected secondary windings having different numbers of turns, (2) a primary winding, and (3) a movable core, said differential transformer exhibiting a curve of voltage output v. core displacement having two legs of different slopes joined by a transitional curve, the slopes of said legs being respectively substantially equal to the slopes of said branches, and an adjustable coupling between said tuning element and said core.

2. Means for remotely controlling the tuning of an oscillator comprising a magnetron tube in accordance with a control voltage and without feeding back the oscillations produced, said magnetron tube having a movable tuning element and exhibiting a curve of frequency of tuning v. displacement of said tuning element comprising two branches of different slopes joined by a transitional curve, said means including (1) a two slope differential transformer comprising two reversely connected secondary windings having different numbers of turns, (2) a primary winding, and (3) a linearly movable core, said differential transformer exhibiting a curve of voltage output v. core displacement having two legs of different slopes joined by a transitional curve, the slopes of said legs being respectively substantially equal to the slopes of said branches, an adjustable mechanical coupling between said tuning element and said core, means for applying an input voltage to said primary winding, mechanical actuator means coupled to said movable tuning element, means for comparing the output voltage of said transformer with said control voltage to provide a difference voltage, and means responsive to said difference voltage for controlling said actuator.

3. Means for remotely controlling the rate of change of tuning of a magnetron oscillator comprising a magnetron tube in accordance with a control voltage and without feeding back the oscillations produced by said oscillator, said magnetron tube having a movable tuning element and exhibiting a curve of frequency of tuning v. displacement of said tuning element comprising two branches of different slopes joined by a transitional curved line, said means including a two slope differential transformer comprising (1) two reversely connected secondary windings having different numbers of turns, (2) a primary winding, and (3) a linearly movable core, said differential transformer exhibiting a curve of voltage output v. core displacement having two legs of different slopes joined by a transitional curved line, the slopes of said branches being respectively substantially equal to the slopes of said legs, an adjustable mechanical coupling between said tuning means and said core, means for applying an input voltage to said primary winding, a mechanical actuator means coupled to said tuning element, means for detecting the output voltage of said transformer and for differentiating said detected output voltage, means for comparing said differentiated voltage with said control voltage to provide a difference voltage, and means responsive to said difference voltage for controlling the speed of said mechanical actuator.

References Cited by the Examiner

UNITED STATES PATENTS

| | | | |
|---|---|---|---|
| 3,089,081 | 5/1963 | Brosh | 336—136 |
| 3,153,211 | 10/1964 | Houpt et al. | 336—136 |

ROY LAKE, *Primary Examiner.*

JOHN KOMINSKI, *Examiner.*